United States Patent
Kataoka

(10) Patent No.: US 6,473,156 B2
(45) Date of Patent: *Oct. 29, 2002

(54) SCANNING EXPOSURE APPARATUS AND DEVICE MANUFACTURING METHOD

(75) Inventor: Yoshiharu Kataoka, Utsunomiya (JP)

(73) Assignee: Canon Kabushiki Kaisha, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/116,884

(22) Filed: Jul. 16, 1998

(65) Prior Publication Data

US 2001/0026356 A1 Oct. 4, 2001

(30) Foreign Application Priority Data

Jul. 22, 1997 (JP) .............................. 9-210200

(51) Int. Cl.[7] .......................... G03B 27/42; G03B 27/32
(52) U.S. Cl. .......................................... 355/53; 355/77
(58) Field of Search ........................... 355/53.16, 53.17, 355/53.24, 53.26, 53.22, 53.2, 53.3, 53, 77, 55, 61, 62, 63; 356/399, 400, 401

(56) References Cited

U.S. PATENT DOCUMENTS

| | | | | |
|---|---|---|---|---|
| 4,704,020 A | * | 11/1987 | Murakami et al. | 355/53.17 |
| 4,958,160 A | * | 9/1990 | Ito et al. | 355/53.24 |
| 5,323,016 A | | 6/1994 | Yamada et al. | 250/559.3 |
| 5,475,490 A | * | 12/1995 | Hirukawa et al. | 355/53.2 |
| 5,489,966 A | * | 2/1996 | Kawashima et al. | 355/53.26 |
| 5,640,227 A | | 6/1997 | Kato et al. | 355/53 |
| 5,737,063 A | * | 4/1998 | Miyachi | 355/53 |
| 5,742,067 A | * | 4/1998 | Imai | 250/548 |
| 5,751,404 A | * | 5/1998 | Murakami et al. | 355/53.2 |
| 5,751,428 A | | 5/1998 | Kataoka et al. | 356/401 |
| 5,796,467 A | * | 8/1998 | Suzuki | 355/53.2 |
| 5,801,815 A | * | 9/1998 | Takahashi | 355/53.26 |
| 6,023,320 A | * | 2/2000 | Kawashima | 355/53 |

FOREIGN PATENT DOCUMENTS

EP 0 756 206 1/1997

* cited by examiner

Primary Examiner—Russell Adams
Assistant Examiner—Rodney Fuller
(74) Attorney, Agent, or Firm—Fitzpatrick, Cella, Harper & Scinto

(57) ABSTRACT

A scanning exposure apparatus includes a first movable stage movable while carrying a first object thereon, a second movable stage movable while carrying a second object thereon, a projection optical system, a scanning system for scanningly moving the first and second stages relative to the projection optical system to project a pattern of the first object onto the second object, reference plates provided on the first movable stage and having predetermined patterns, a detecting system for detecting positions of the reference plates with respect to an exposure optical axis direction of the projection optical system, a measuring system for measuring a position of the first movable stage with respect to a scan direction, a storing system for storing therein the positions with respect to the optical axis direction as detected by the detecting system and the position with respect to the scan direction at the corresponding moment, and a correcting system for correcting, during the scan of the first and second objects, a positional relation between the projection optical system and a surface of the second object to be exposed, with respect to the optical axis direction, on the basis of the stored positional relation between the reference plates and the projection optical system.

30 Claims, 7 Drawing Sheets

SCANNING EXPOSURE APPARATUS AND DEVICE MANUFACTURING METHOD

FIELD OF THE INVENTION AND RELATED ART

This invention relates to an exposure apparatus for use in a semiconductor device manufacturing process and, more particularly, to a scanning exposure apparatus wherein, in projection exposure for printing a pattern of a photomask or reticle onto a wafer, the mask and the wafer are scanned in synchronism with each other relative to a projection optical system. In another aspect, the invention is concerned with a device manufacturing method which uses such a scanning exposure apparatus.

Semiconductor manufacturing technology is being advanced considerably, and fine processing techniques therefor are also developing more and more. In optical processing techniques, reduction projection exposure apparatuses with submicron order resolution, called steppers, are used prevalently. Further improvement of resolution, further enlargement of numerical aperture (NA), and a further reduction of the wavelength of exposure light are desired in this field.

Those scanning exposure apparatus have received much attraction, such as one wherein a unit-magnification scanning exposure apparatus having a reflection projection optical system is modified and a refractive element or elements are incorporated into the projection exposure apparatus, or one wherein a reduction projection optical system consisting only of refractive elements is used and both a mask stage and a stage (wafer stage) for a photosensitive substrate are scanned in synchronism with each other and at a speed ratio corresponding to the reduction magnification.

For mask pattern image focusing in these types of exposure apparatuses, level measurement and autofocus and autoleveing correction drive are successively carried out during the scan exposure, so as to sequentially register the surface of a photosensitive substrate to be exposed with respect to the best imaging plane of a projection optical system.

For the level and surface position detecting mechanism to be used in these types of apparatuses, there is a method wherein an oblique incidence optical system in which light is projected to a wafer surface obliquely from above is used and wherein reflection light from the photosensitive substrate is detected as a positional deviation upon a sensor, or a method wherein a gap sensor such as an air micro-sensor or an electrostatic capacitance sensor is used. In these methods, from level measured values obtained during the scan, correction drive for the level and tilt of each measurement position as it passes the exposure slit region are calculated, and then correction is carried out.

Conventionally, in step-and-repeat type exposure apparatuses or scanning exposure apparatuses as described above, the focusing mechanism for the photosensitive substrate and the imaging plane of the projection optical system are provided only on the photosensitive substrate side.

In scanning exposure apparatuses, however, there are cases wherein the surface for carrying a mask thereon tilts with scan of the mask, relative to a mask stage. If this occurs, it causes a change in tilt of the mask which cannot be corrected by the focusing mechanism upon the exposure surface of the photosensitive substrate. Thus, it results in defocus.

For example, if a six-inch mask is used and the surface for carrying the mask thereon tilts by 20 ppm with respect to the scan direction, then the distance between the mask pattern and a projection optical system may change by about 3 microns during the scan of the whole mask surface. If the projection optical system has a reduction magnification of 1:4, the amount of shift of the image plane may be 0.19 micron. The numerical aperture of projection optical systems is increasing so as to meet the miniaturization of a circuit pattern, and the allowable depth of focus during the transfer process is decreasing. Thus, such a shift cannot be disregarded.

SUMMARY OF THE INVENTION

It is accordingly an object of the present invention to provide a scanning exposure apparatus and/or a device manufacturing method by which, even if tilt of a mask carrying surface with respect to a mask stage changes, the surface of a photosensitive substrate to be exposed can be focused precisely with respect to an imaging plane of a projection optical system, constantly.

In accordance with an aspect of the present invention, there is provided a scanning exposure apparatus, comprising: a first movable stage being movable while carrying a first object (mask) thereon; a second movable stage being movable while carrying a second object (wafer) thereon; a projection optical system; scanning means for scanningly moving said first and second stages in synchronism with each other and relative to said projection optical system so as to project a pattern of the first object onto the second object; reference plates provided on said first movable stage and having predetermined patterns; detecting means for detecting positions of said reference plates with respect to an exposure optical axis direction of said projection optical system; measuring means for measuring a position of said first movable stage with respect to a scan direction; storing means for storing therein the positions with respect to the optical axis direction as detected by said detecting means and the position with respect to the scan direction at the corresponding moment; and correcting means for correcting, during the scan of the first and second objects, a positional relation between said projection optical system and a surface of the second object to be exposed, with respect to the optical axis direction, on the basis of the stored positional relation between the reference plates and the projection optical system.

The detecting means may include (i) a reflection surface plate providing on said second movable stage at a position substantially corresponding to that of the second object with respect to the optical axis direction, (ii) a light source for projecting, through said projection optical system, a mark of the reference plate onto said reflection surface plate, (iii) light receiving means for receiving light reflected by the reflection surface, through said projection optical system and a transmissive portion of the mark of the reference plate, and (iv) surface position measuring means for measuring a position of one of the second object and said reflection surface plate with respect to the optical axis direction. The position of the reference plate relative to said projection optical system with respect to the optical axis direction may be detected on the basis of an output signal of said light receiving means and the position of said second movable stage with respect to the optical axis direction.

The reference plates may preferably be provided on the first movable stage with deviation.

The angle between said first movable stage and the first object carrying surface thereof may be calculated on the basis of relative positions between the reference plates and the projection optical system, and said correcting means may correct the positional relation between said projection optical system and the surface of the second object to be exposed, continuously on the basis of the calculated angle.

The reference plates are provided at two or more locations, sandwiching the pattern transfer region of the mask upon said first movable stage, in order to enable calculation of an angle between said first movable stage and the first object carrying surface, the angle being defined while taking a line orthogonally intersecting the scan direction on said first movable stage as an axis.

Each reference plate may have marks disposed in a direction perpendicular to the scan direction upon the reference plate, in order to enable calculation of an average angle, taking the line orthogonally intersecting the scan direction on said first movable stage as an axis.

There may be at least two reflection surface plates disposed to sandwich the second object surface, corresponding to scan positions of the reference plate.

The surface position measuring means may comprise off-axis surface position detecting means including (i) a light projecting system for projecting and forming, without said projection optical system, a pattern in an oblique direction with respect to the exposure optical axis onto one of the second object surface and the reflection surface plate, and (ii) a light receiving system for re-imaging an image of the pattern on a surface of a light receiving element, and positional information related to one of the second object surface and the reflection surface plate with respect to the optical axis direction may be produced on the basis of a positional signal of the image of the pattern as re-imaged on the light receiving element.

In accordance with another aspect of the present invention, there is provided a device manufacturing method wherein a first movable stage being movable while carrying a first object thereon and a second movable stage being movable while carrying a second object thereon are scanningly moved in synchronism with each other and relative to a projection optical system so that a pattern of the first object is projected onto the second object, said method comprising the steps of: detecting positions of marks provided on the first movable stage and disposed with a deviation in a scan direction, relative to the projection optical system and with respect to an exposure optical axis direction; measuring a position of the first movable stage with respect to the scan direction; storing the positions with respect to the optical axis direction as detected at said detecting step and the position with respect to the scan direction at the corresponding moment; and correcting, during the scan of the mask and the wafer, a positional relation between the projection optical system and a surface of the wafer to be exposed, with respect to the optical axis direction, on the basis of the stored positional relation between the reference plates and the projection optical system.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Figure 1:
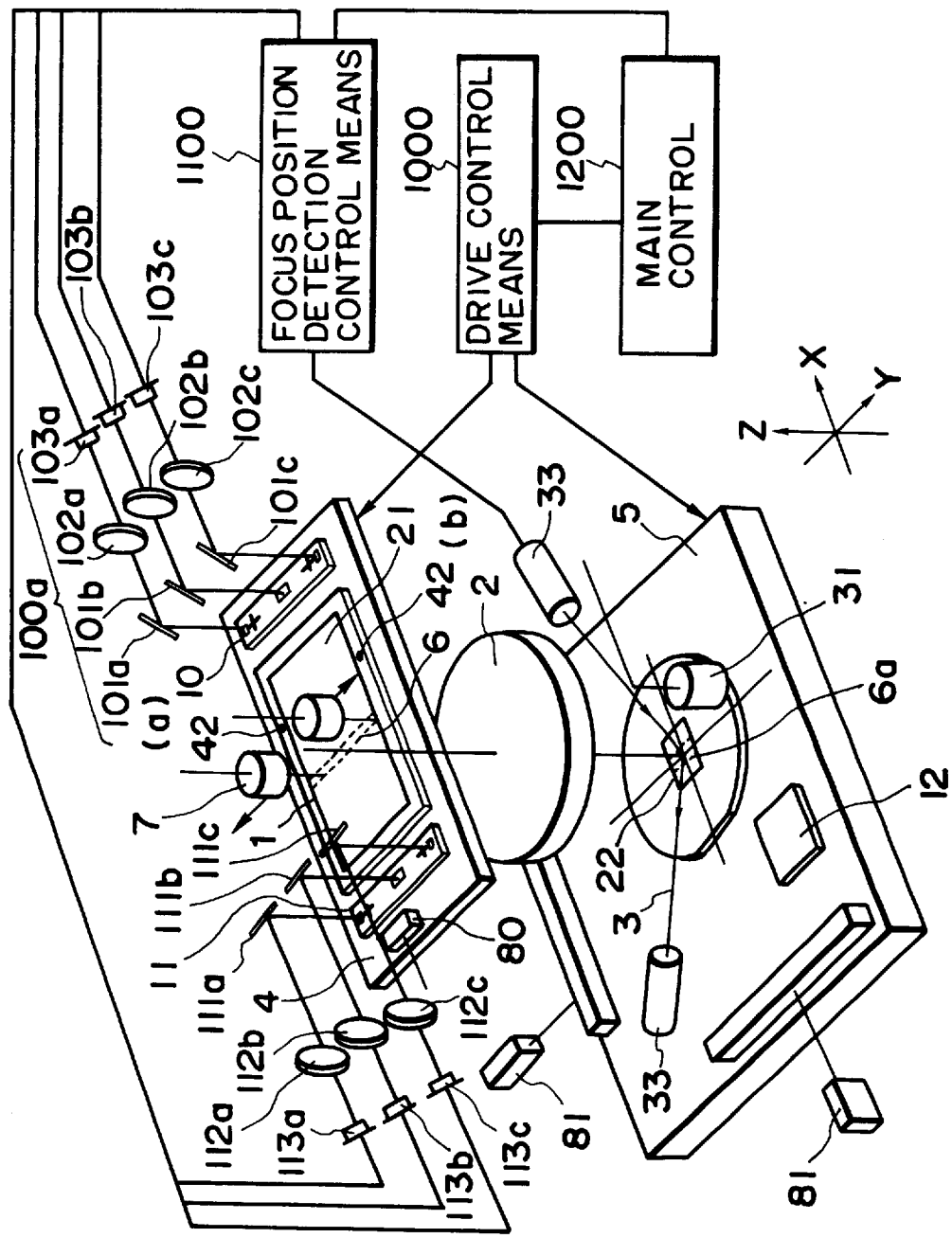
FIG. 1 is a schematic view of a scanning exposure apparatus according to a first embodiment of the present invention.
Figure 2:
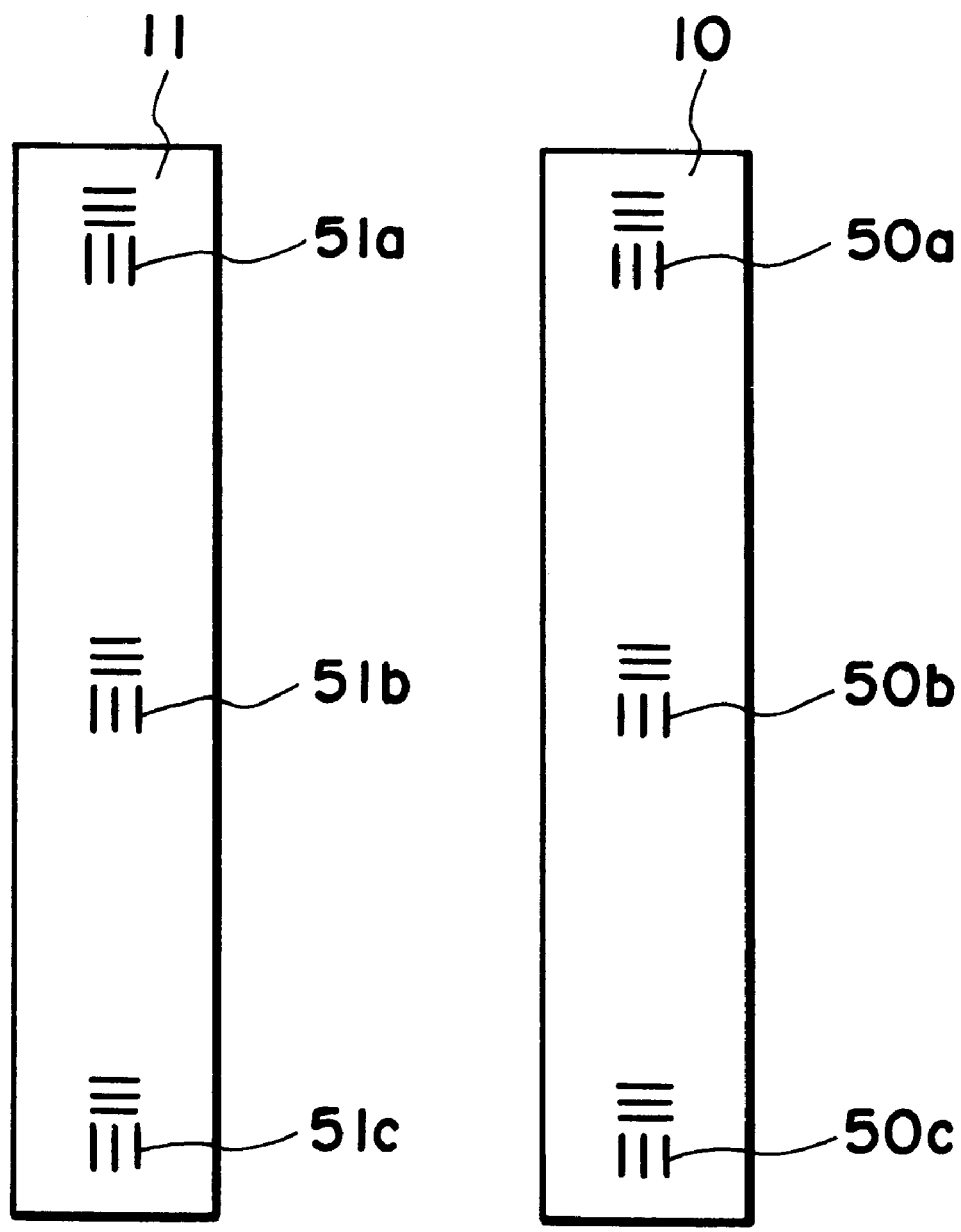
FIG. 2 is an enlarged view of a portion of FIG. 1.

FIG. 1 is a schematic view of an embodiment of the present invention as it is applied to a step-and-scan type projection exposure apparatus. FIG. 2 is a schematic and enlarged view of reference plates in FIG. 1. This embodiment shows a scanning exposure apparatus wherein exposure light emitted from a light source of a pulse laser is projected through an illumination optical system to illuminate a mask 1 as slit-like light 6, and a circuit pattern formed on the mask 1 is projected and printed through scanning, in a reduced scale on a wafer 3, coated with a photosensitive material, by a projection lens (projection optical system) 2.

In FIG. 1, the mask 1 has a circuit pattern formed thereon, and it is placed on a mask stage (first movable stage) 4 which is drive controlled in the X direction by drive control means 1000 and a laser interferometer 80. The mask stage 4 can be driven in the X direction, while the position thereof relative to the projection optical system 2 with respect to the Z direction is kept constant.

A wafer or photosensitive substrate 3 is placed on a wafer stage (second movable stage) 5 which is drive controlled in the X and Y directions by the drive control means 1000 and a laser interferometer 81. Further, the position in the Z direction of and tilt of the wafer stage 5 can be drive controlled, relative to the projection optical system 2.

The mask 1 and the wafer 3 are placed at positions which are optically conjugate with each other with respect to the projection optical system 2, and, by means of an illumination system (not shown), exposure light 6 of a slit-like shape being elongated in the Y direction is formed on the mask 1. The exposure light 6 on the mask 1 then provides slit-like exposure light 6a on the wafer 3, with a size proportional to the projection magnification of the projection optical system 2.

In a scanning reduction projection exposure process, both the mask stage 4 and the wafer stage 5 are moved in the X direction, relative to the slit-like exposure light 6 and exposure light 6a, at a speed ratio corresponding to the optical magnification of the projection optical system 2. Through the scanning of the pattern transfer region 21 on the mask 1 and the pattern transfer region 22 on the wafer 3 with the slit-like exposure light 6 and exposure light 6a, the scan exposure is performed. Denoted at 7 is a microscope for observation of the mask 1 surface.

Position detecting means for detecting the position of the mask 1 and the projection optical system 2 with respect to the optical axis direction (Z axis direction) performs the detection by using plates 10 and 11 which are provided on the mask stage 4. On the basis of the result of the detection, the wafer stage 5 is driven through the drive control means 1000, by which the position of a reference plate with respect to an imaging plane of the projection optical system 2 is detected.

The position detecting means may be based on a TTL autofocus method wherein, for example, a slit image is projected on the wafer stage surface through the projection lens, and the light is received through a slit and by a detector. The best focus position can be determined on the basis of the quantity of received light. Alternatively, it may comprise a system wherein image contrast is detected through the projection lens.

Next, the imaging plane of the projection optical system 2 and a reference plate position detecting mechanism of this embodiment will be described. Denoted at 10 and 11 are reference plates such as shown in FIG. 2, for example. These reference plates have marks 50 (50*a*, 50*b*, 50*c*) and marks 51 (51*a*, 51*b*, 51*c*) formed on the plates, respectively. These marks 50 and 51 are set at the same position as the circuit pattern of the mask 1, with respect to the optical axis direction. The plates 10 and 11 are mounted on the mask stage 4.

The marks 50 and 51 are provided by line-and-space marks with local transmissivity, formed by depositing Cr on a glass substrate, for example. As shown in FIG. 2, these marks are defined at different positions 50*a*–50*c* and 51*a*–51*c* on reference plates 10 and 11 with respect to the Y direction. With these marks, a change in image plane of the projection optical system 2 with respect to the lengthwise direction of the slit (i.e., in the Y direction) can be detected. Also, as shown in FIG. 1, disposed above the three marks 50*a*–50*c* (51*a*–51*c*) of the reference plate 10 (11) are half mirrors 101*a*–101*c* (111*a*–11*c*), condenser lenses 102*a*–102*c* (112*a*–112*c*) and light receiving elements 103*a*–103*c* (113*a*–113*c*), corresponding to the marks, respectively. Here, one half mirror (e.g., 101*a*), one condenser lens (e.g., 102*a*) and one light receiving element (e.g., 103*a*) constitute one light receiving system (e.g., 100*a*).

On the other hand, there is a reflection surface plate 12 mounted on the wafer stage 5. The surface of this reflection surface plate 12 is set substantially at the same height as the wafer 3 surface. The surface position of the wafer 3 with respect to the optical axis of the projection optical system 2 is detected by a surface position detecting mechanism 33 which is based on an off-axis oblique incidence method. Namely, the surface position detecting mechanism 33 can detect the position and tilt with respect to the Z direction.

Here, in the surface position detecting mechanism 33 of an off-axis surface position detecting system, as an example, a light projecting system may project a pattern or light spot upon the wafer surface, and a light receiving system then forms the pattern or light spot, defined on the wafer surface, on a sensor surface. Since positional information related to the pattern or light spot is in a predetermined relationship with the position of the wafer surface with respect to the optical axis direction, the surface position of the wafer with respect to the optical axis direction can be detected by detecting the positional information upon the sensor surface.

Figure 3:
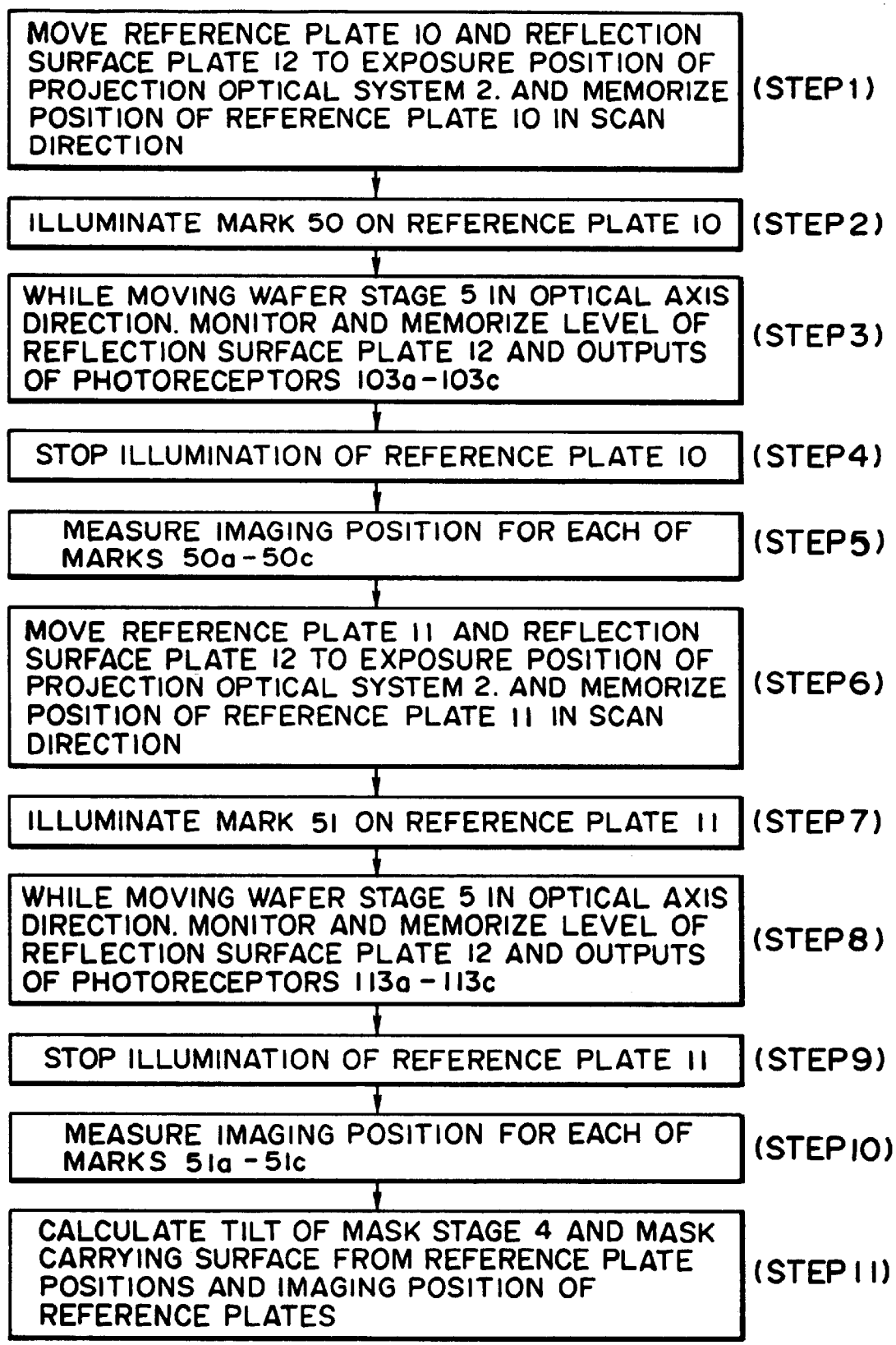
FIG. 3 is a flow chart for explaining measurement of a positional relation between a mask stage and a surface for carrying a mask thereon.

FIG. 3 is a flow chart for explaining a position detecting method by use of the projection optical system and the reference plates 10 and 11.

First, the drive control means 1000 drives the mask stage 4 and the wafer stage 5 so that the reference plate 10 on the mask stage 4 and the reflection surface plate 12 on the wafer stage 5 are placed on the optical axis of the projection optical system 2. Then, the position of the reference plate 10 with respect to the scan direction, at that time, is memorized (step 1). At this moment, the mark 50 (50*a*–50*c*) of the reference plate 10 is registered with the region to be illuminated by slit-like exposure light 6.

Then, by means of an illumination system (not shown), illumination light is projected by way of the half mirror 101 (101*a*–10*c*) to illuminate the mark 50 on the reference plate (step 2). Here, the illumination light may be the same as or different from exposure light to be used for exposure of the wafer 3 to print the mask 1 pattern thereon.

The light passing through the mark 50 goes through the projection optical system 2 and is collected on and reflected by the reflection surface plate 12. The light reflected by the reflection surface plate 12 goes again through the projection optical system 2 and it is collected on the mark 50. Here, a portion of the light passes through the mark 50 and, after being reflected by the half mirror 101, it goes through the condenser lens 102 (102*a*–102*c*) and is received by the light receiving element 103 (103*a*–103*c*).

At step 3, while the wafer stage 5 is moved along the optical axis direction, the level (height) of the reflection surface plate 12 is measured by use of the surface position detecting mechanism 33. Also, the outputs of the light receiving elements 103*a*–103*c* are monitored and memorized. The light receiving element 103 (103*a*–103*c*) produces an output corresponding to the mark 50 (50*a*–50*c*) on the reference plate 10. The Z position with which the output of the light receiving element 103 becomes highest corresponds to the best imaging position of the marks 50*a*–50*c*. Thus, after the monitoring of the output of the light receiving element 103 is completed, illumination of the reference plate 10 is stopped (step 4), and with respect to each of the marks 50*a*–50*c*, the imaging position is measured (step 5).

Here, the position Mx0 of the reference plate 10 with respect to the scan direction as obtained at that time through the laser interferometer 80 as well as positional data Za0, Zb0 and Zc0 related to the best imaging plane positions of the marks 50*a*, 50*b* and 50*c* of the reference plate, respectively, are memorized in one set, into a memory.

Subsequently, the drive control means 1000 moves the mask stage 4 so that the reference plate 11 on the mask stage 4 and the reflection surface plate 12 on the wafer stage 5 are placed on the optical axis of the projection optical system 2. Then, the position of the reference plate 11 with respect to the scan direction at that time is memorized (step 6). At this moment, the mark 51 (51*a*–51*c*) on the reference plate 11 is registered with the region to be illuminated by the slit-like exposure light 6.

Additionally, by means of the illumination system (not shown), illumination light is projected by way of the half mirror 111 (111*a*–111*c*) to illuminate the mark 51 on the reference plate (step 7). Thus, the manner of detecting best imaging plane position of the marks 51*a*–51*c* on the reference plate 11 (steps 6–10) is the same as the detection of the best imaging plane position of the marks 50*a*–50*c*. Similarly, the position Mx1 of the reference plate 11 as obtained at that time through the laser interferometer 81 as well as positional data Za1, Zb1 and Zc1. related to the best imaging plane positions of the marks 51*a*, 51*b* and 51*c* on the reference plate, respectively, are memorized in one set, into a memory.

The tilt between the surface on which a mask is placed and the mask stage, with respect to the scan direction, can be detected in accordance with the following equation (step 11).

$$\theta = \tan^{-1}\{[(Za0+Zb0+Zc0) - (Za1+Zb1+Zc1)]/3(Mx0-Mx1)\}$$

It is to be noted that in this embodiment the number of the marks of each reference plate is not limited to three, and it may be one. Use of plural marks will provide an averaging effect of calculation.

Next, a correcting mechanism for correcting the positional relationship between the exposure plane and an imaging plane of a projection optical system on the basis of positional data stored as described above, in this embodiment, will be described.

Figure 4:
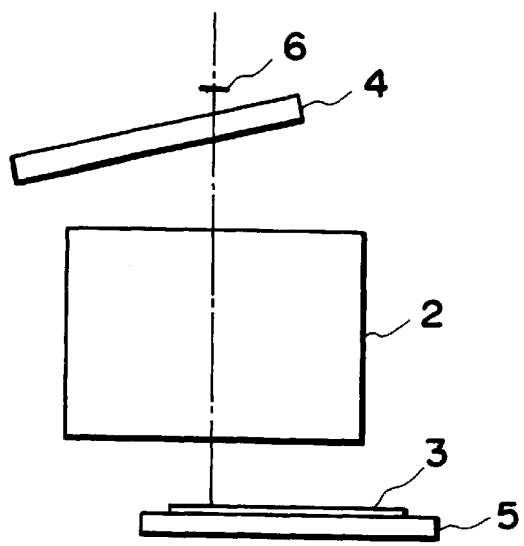
FIG. 4 is a schematic view for explaining a positional relation between a mask stage and a wafer stage as a mask is positioned on the left-hand side.
Figure 5:
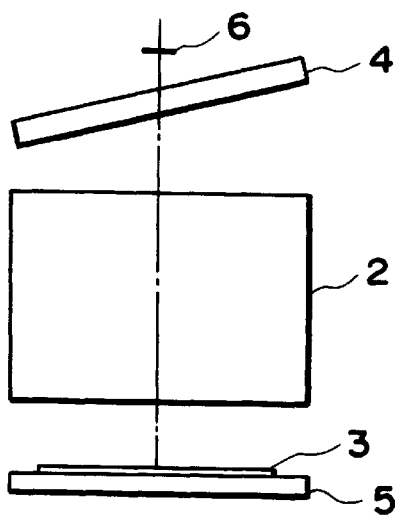
FIG. 5 is a schematic view for explaining a positional relation between the mask stage and the wafer stage as the mask is positioned at the center.
Figure 6:
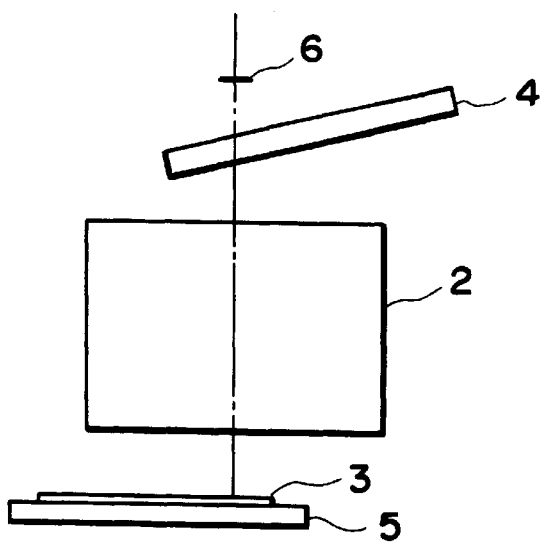
FIG. 6 is a schematic view for explaining a positional relation between the mask stage and the wafer stage as the mask is positioned on the right-hand side.

FIGS. 4, 5 and 6 show examples wherein there is a tilt between a mask stage and a surface for carrying a mask thereon, during the scanning exposure operation.

FIG. 4 shows an example of a positional relation between the mask stage 4 and the wafer stage 5 as the mask 4 is positioned on the left-hand side. FIG. 5 shows the positional relation between the mask stage 4 and the wafer stage 5 as the mask stage 4 is positioned at the center. FIG. 6 shows the positional relation between the mask 4 and the wafer 5 as the mask stage 4 is positioned on the right-hand side. It is seen that the level of the mask stage 4 within the slit-like exposure light flux changes with the scan position.

The operation for scan exposure of a pattern of a mask will now be described. Main control 1200 starts scan motion of the mask stage 4 and the wafer stage 5. Simultaneously, the main control 1200 calculates a deviation in height direction of the mask stage 4 on the basis of θm, and converts it into the amount of correction upon the wafer while multiplying it by a square of the reduction projection magnification. Then, the off-axis surface position detecting system 33 detects the focus position of the wafer 3 with respect to the optical axis direction. The main control 1200 adds to that measured value the amount of change of the mask stage in the Z direction, and controls the drive control means 1000 to drive the stage 5 so that the wafer 3 is brought into registration with the imaging plane.

In accordance with the scanning exposure apparatus as described above, the positional relation between the mask stage and a surface for carrying a mask thereon is measured and memorized, and during the exposure operation the focus position of the photosensitive substrate is corrected in accordance with the scan position of the mask stage. Thus, even if the positional relation between the mask and the projection optical system changes during the scan due to a tilt between the mask stage and the mask carrying surface, the surface of the photosensitive substrate can be positioned with respect to the imaging plane of the projection optical system very precisely.

Figure 7:
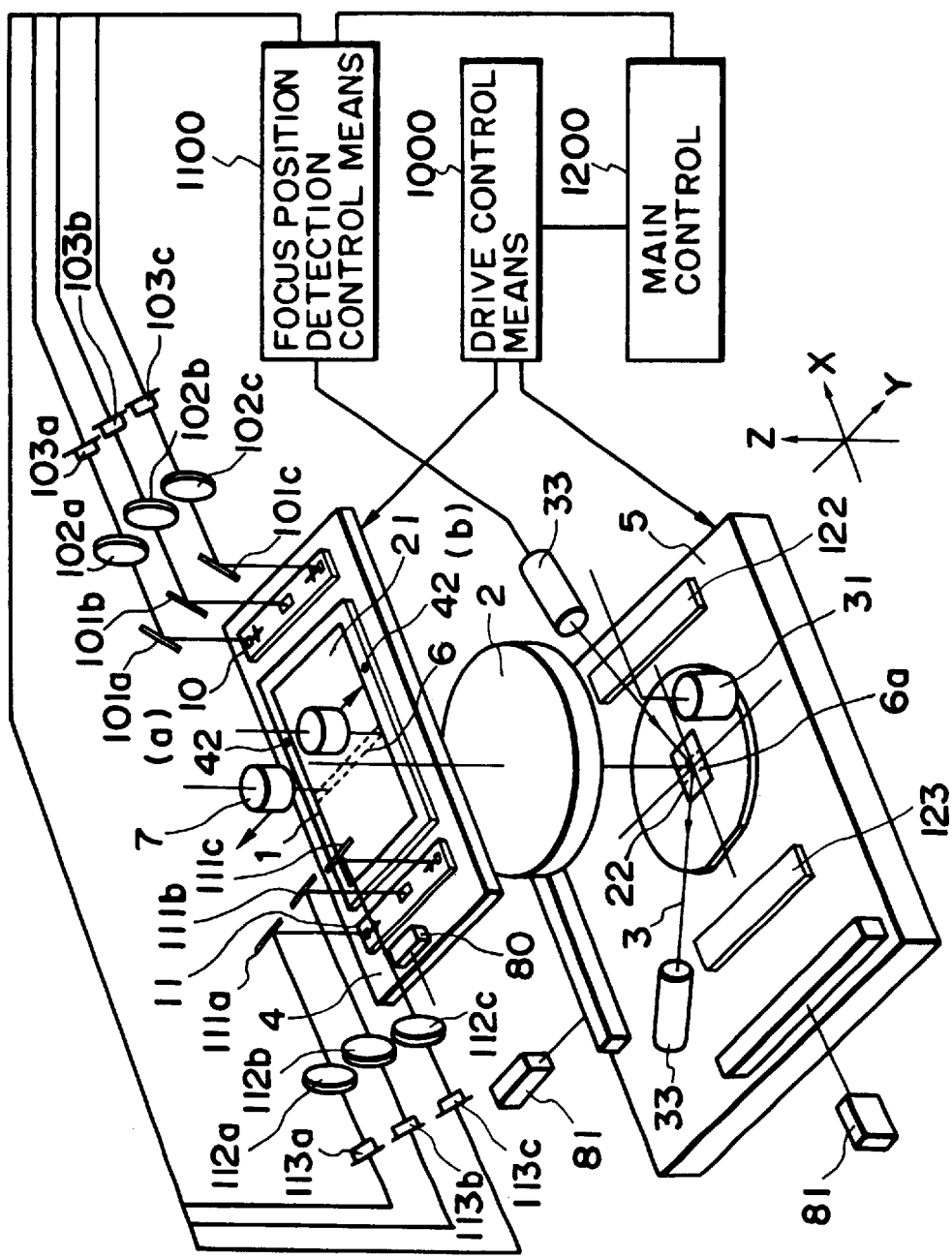
FIG. 7 is a schematic view of a scanning exposure apparatus according to a second embodiment of the present invention.

FIG. 7 shows another embodiment of the present invention. In this embodiment, the reflection surface plate 12 of the first embodiment is replaced by two elongated reflection surface plates 122 and 123 which are provided on the wafer stage 5 and which extend in the same direction as the direction of elongation of the slit-like exposure region 6a. These plates are disposed to sandwich the wafer 3 in the scan direction. In accordance with this embodiment, for measurement of the distance between the imaging plane and the reference plate with respect to the optical axis direction, it is not necessary to move the wafer stage 5 in the Y direction. Thus, a higher throughput than that of the first embodiment is attainable.

Next, an embodiment of a device manufacturing method which uses an exposure apparatus such as described above, will be described.

Figure 8:
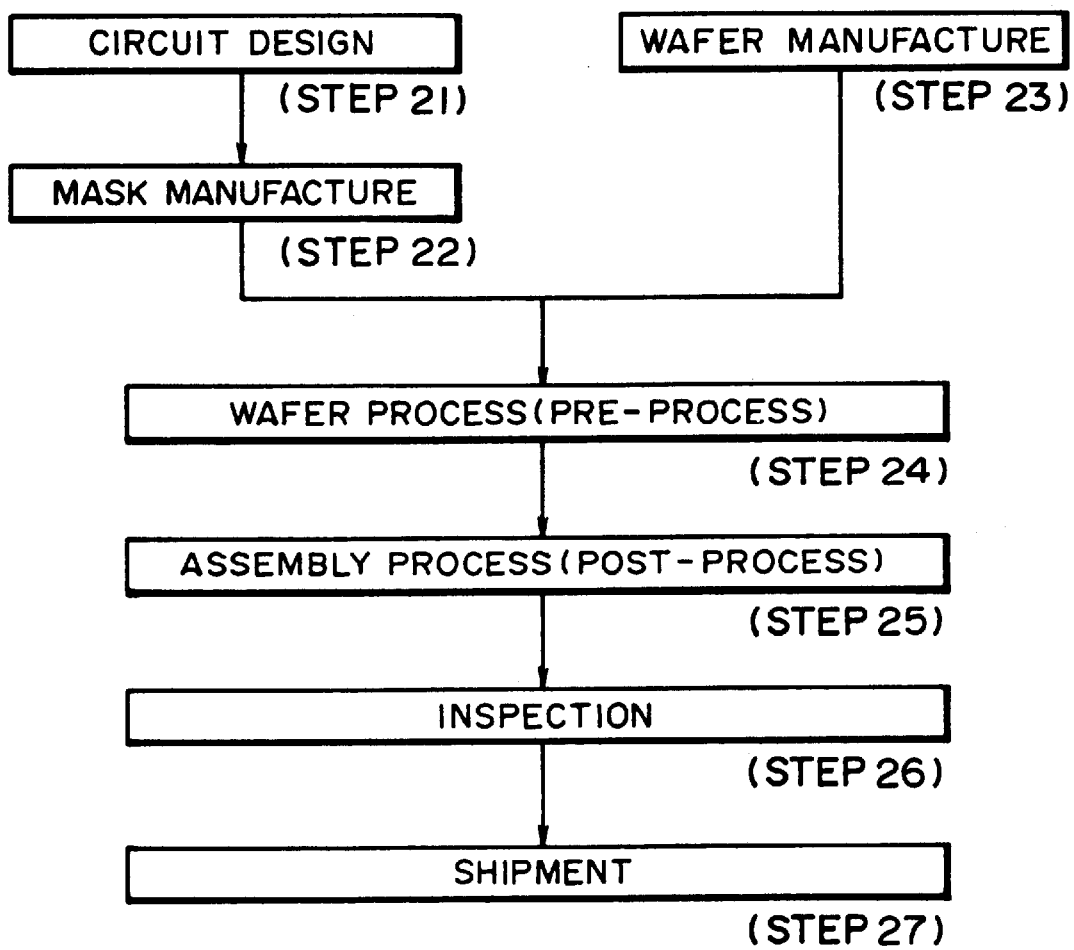
FIG. 8 is a flow chart of microdevice manufacturing processes.

FIG. 8 is a flow chart of a procedure for the manufacture of microdevices such as semiconductor chips (e.g., ICs or LSIS), liquid crystal panels, CCDs, thin film magnetic heads or micro-machines, for example. Step 21 is a design process for designing a circuit of a semiconductor device. Step 22 is a process for making a mask on the basis of the circuit pattern design. Step 23 is a process for preparing a wafer by using a material such as silicon. Step 24 is a wafer process which is called a pre-process wherein, by using the so prepared mask and wafer, circuits are practically formed on the wafer through lithography. Step 25 subsequent to this is an assembling step which is called a post-process wherein the wafer having been processed by step 24 is formed into semiconductor chips. This step includes an assembling (dicing and bonding) process and a packaging (chip sealing) process. Step 26 is an inspection step wherein an operation check, a durability check and so on for the semiconductor devices provided by step 25, are carried out. With these processes, semiconductor devices are completed and they are shipped (step 27).

Figure 9:
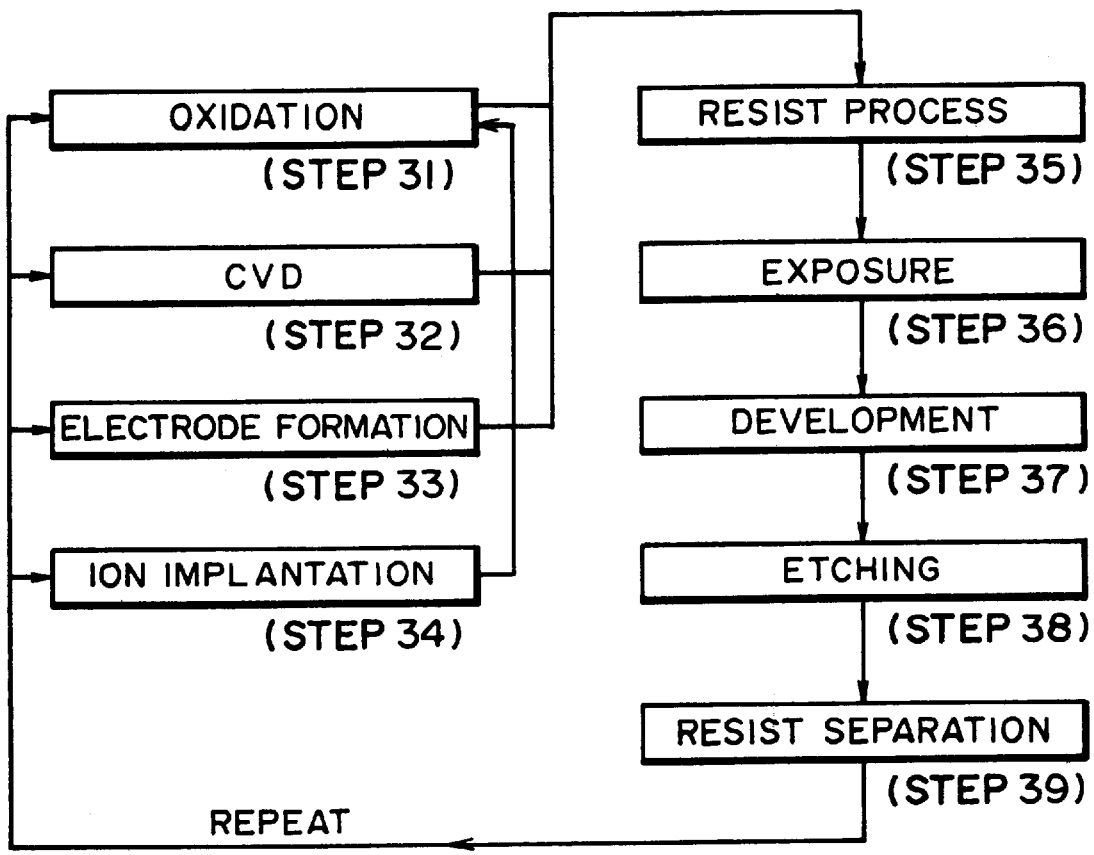
FIG. 9 is a flow chart for explaining details of a wafer process in the procedure of FIG. 8.

FIG. 9 is a flow chart showing details of the wafer process. Step 31 is an oxidation process for oxidizing the surface of a wafer. Step 32 is a CVD process for forming an insulating film on the wafer surface. Step 33 is an electrode forming process for forming electrodes upon the wafer by vapor deposition. Step 34 is an ion implanting process for implanting ions to the wafer. Step 35 is a resist process for applying a resist (photosensitive material) to the wafer. Step 36 is an exposure process for printing, by exposure, the circuit pattern of the mask on the wafer through the exposure apparatus described above. Step 37 is a developing process for developing the exposed wafer. Step 38 is an etching process for removing portions other than the developed resist image. Step 39 is a resist separation process for separating the resist material remaining on the wafer after being subjected to the etching process. By repeating these processes, circuit patterns are superposedly formed on the wafer.

In this embodiment, in the processes performed repeatedly, during the exposure operation (step 36) a deviation of the wafer best imaging plane position due to a tilt of the mask carrying surface can be corrected such that accurate exposure is assured.

While the invention has been described with reference to the structures disclosed herein, it is not confined to the details set forth and this application is intended to cover such modifications or changes as may come within the purposes of the improvements or the scope of the following claims.

What is claimed is:

1. A scanning exposure apparatus, comprising:
   a first movable stage being movable while carrying a first object thereon;
   a second movable stage being movable while carrying a second object thereon;
   a projection optical system for projecting a pattern of the first object onto the second object along an exposure optical axis direction;
   scanning means for scanningly moving said first and second stages in synchronism with each other and relative to said projection optical system so as to project the pattern of the first object onto the second object through said projection optical system;
   reference plates provided on said first movable stage and having predetermined patterns, said reference plates being arrayed along a scan direction of said scanning means, and said first movable stage being movable so as to place, sequentially, each of said reference plates at a detection position;

detecting means for detecting positions of said reference plates with respect to the exposure optical axis direction of said projection optical system as each of said reference plates is placed, sequentially, at the detection position;

measuring means for measuring a position of said first movable stage with respect to the scan direction;

storing means for storing therein the positions with respect to the optical axis direction as detected by said detecting means and the position with respect to the scan direction at the corresponding moment; and correcting means for correcting, during the scan of the first and second objects, a positional relation between said projection optical system and a surface of the second object to be exposed, with respect to the optical axis direction, on the basis of the stored positional relation between the reference plates and the projection optical system.

2. An apparatus according to claim 1, wherein said detecting means includes (i) a reflection surface plate provided on said second movable stage at a position corresponding to that of the second object with respect to the optical axis direction, (ii) a light source for projecting, through said projection optical system, a mark of the reference plate onto said reflection surface plate, (iii) light receiving means for receiving light reflected by the reflection surface, through said projection optical system and a transmissive portion of the mark of the reference plate, and (iv) surface position measuring means for measuring a position of one of the second object and said reflection surface plate with respect to the optical axis direction, wherein the position of the reference plate relative to said projection optical system with respect to the optical axis direction is detected on the basis of an output signal of said light receiving means and the position of said second movable stage with respect to the optical axis direction.

3. An apparatus according to claim 2, wherein said surface position measuring means comprises off-axis surface position detecting means including (i) a light projecting system for projecting and forming, without said projection optical system, a pattern in an oblique direction with respect to the exposure optical axis onto one of the second object surface and the reflection surface plate, and (ii) a light receiving system for re-imaging an image of the pattern on a surface of a light receiving element, and positional information related to one of the second object surface and the reflection surface plate with respect to the optical axis direction is produced on the basis of a positional signal of the image of the pattern as re-imaged on the light receiving element.

4. An apparatus according to claim 1, wherein an angle between said first movable stage and the first object carrying surface thereof is calculated on the basis of relative positions between said reference plates and the projection optical system, and said correcting means corrects the positional relation between said projection optical system and the surface of the second object to be exposed, continuously on the basis of the calculated angle.

5. An apparatus according to claim 4, wherein said reference plates are provided at two or more locations, sandwiching the first object surface upon said first movable stage, in order to enable calculation of an angle between said first movable stage and the first object carrying surface, the angle being defined while taking a line orthogonally intersecting the scan direction on said first movable stage as an axis.

6. An apparatus according to claim 4, wherein said surface position measuring means comprises off-axis surface position detecting means including (i) a light projecting system for projecting and forming, without said projection optical system, a pattern in an oblique direction with respect to the exposure optical axis onto one of the second object surface and the reflection surface plate, and (ii) a light receiving system for re-imaging an image of the pattern on a surface of a light receiving element, and positional information related to one of the second object surface and the reflection surface plate with respect to the optical axis direction is produced on the basis of a positional signal of the image of the pattern as re-imaged on the light receiving element.

7. An apparatus according to claim 5, wherein each reference plate has marks disposed in a direction perpendicular to the scan direction upon the reference plate, in order to enable calculation of an average angle taking the line orthogonally intersecting the scan direction on said first movable stage as an axis.

8. An apparatus according to claim 5, wherein said surface position measuring means comprises off-axis surface position detecting means including (i) a light projecting system for projecting and forming, without said projection optical system, a pattern in an oblique direction with respect to the exposure optical axis onto one of the second object surface and the reflection surface plate, and (ii) a light receiving system for re-imaging an image of the pattern on a surface of a light receiving element, and positional information related to one of the second object surface and the reflection surface plate with respect to the optical axis direction is produced on the basis of a positional signal of the image of the pattern as re-imaged on the light receiving element.

9. An apparatus according to claim 7, further comprising at least two reflection surface plates, which are disposed to sandwich the second object surface, corresponding to scan positions of the reference plate.

10. An apparatus according to claim 7, wherein said surface position measuring means comprises off-axis surface position detecting means including (i) a light projecting system for projecting and forming, without said projection optical system, a pattern in an oblique direction with respect to the exposure optical axis onto one of the second object surface and the reflection surface plate, and (ii) a light receiving system for re-imaging an image of the pattern on a surface of a light receiving element, and positional information related to one of the second object surface and the reflection surface plate with respect to the optical axis direction is produced on the basis of a positional signal of the image of the pattern as re-imaged on the light receiving element.

11. An apparatus according to claim 9, wherein said surface position measuring means comprises off-axis surface position detecting means including (i) a light projecting system for projecting and forming, without said projection optical system, a pattern in an oblique direction with respect to the exposure optical axis onto one of the second object surface and the reflection surface plate, and (ii) a light receiving system for re-imaging an image of the pattern on a surface of a light receiving element, and positional information related to one of the second object surface and the reflection surface plate with respect to the optical axis direction is produced on the basis of a positional signal of the image of the pattern as re-imaged on the light receiving element.

12. An apparatus according to claim 1, wherein the first object comprises a mask having a pattern while the second object comprises a wafer, and the pattern of the mask is sequentially transferred to different regions on the wafer in accordance with a step-and-repeat sequence.

13. A device manufacturing method wherein a first movable stage being movable while carrying a first object thereon and a second movable stage being movable while carrying a second object thereon are scanningly moved in synchronism with each other and relative to a projection optical system so that a pattern of the first object is projected onto the second object, said method comprising the steps of:

detecting, sequentially, positions of marks provided on the first movable stage and spaced apart in a scan direction, relative to the projection optical system and with respect to an exposure optical axis direction, as the first movable stage is moved to place, sequentially, the marks in a detection position;

measuring a position of the first movable stage with respect to the scan direction;

storing the positions with respect to the optical axis direction as detected in said detecting step and the position with respect to the scan direction at the corresponding moment; and correcting, during the scan of the first object and the second object, a positional relation between the projection optical system and a surface of the second object, with respect to the optical axis direction, on the basis of the stored positional relation between the marks and the projection optical system.

14. A method according to claim 13, wherein the first object comprises a mask having a pattern while the second object comprises a wafer, and the pattern of the mask is sequentially transferred to different regions on the wafer in accordance with a step-and-repeat sequence.

15. A method according to claim 13, wherein said detecting step performs detection in accordance with a through-the-lens autofocus process.

16. A method of manufacturing a device utilizing a scanning exposure apparatus including a mask stage having provided thereon a plurality of reference plates spaced apart in a scan direction, a wafer stage having provided thereon at least one reflection surface plate, and a projection optical system for projecting a pattern of a mask carried on the mask stage onto a wafer carried on the wafer stage as the mask stage and wafer stage are moved synchronously relative to one another, the method comprising the steps of:

driving the mask stage so that, sequentially, a respective one of the plurality of reference plates is aligned with an optical axis of the projection optical system;

positioning the wafer stage so that the reflection surface plate is in line with the optical axis;

illuminating, while each respective reference plate is aligned with the optical axis, at least one mark on the reference plate so that light passing through the mark passes through the projection optical system and is reflected by the reflection surface plate;

moving, while the at least one mark on each respective reference plate is being illuminated, the wafer stage in the direction of the optical axis;

determining, based on the light reflected by the reflection surface plate, a preferred level along the optical axis for the wafer stage where imaging occurs when the at least one mark on each respective reference plate is illuminated;

storing the preferred levels for the wafer stage in association with corresponding positions of the reference plates along the scan direction;

calculating a degree of tilt of the mask stage in the scan direction based on the stored preferred levels for the wafer stage and corresponding positions of the reference plates; and controlling, during a scan operation in which the mask pattern is projected onto the wafer, the level of the wafer stage to compensate for the degree of tilt of the mask stage.

17. A scanning exposure apparatus, comprising:

a first movable stage being movable while carrying a first object thereon;

a second movable stage being movable while carrying a second object thereon;

scanning means for scanningly moving said first and second stages in synchronism with each other and relative to a projection optical system so as to project the pattern of the object onto the second object through the projection optical system;

reference plates provided on said first movable stage and having predetermined patterns, said first movable stage being movable so as to place, sequentially, each of said reference plates at a detection position;

detecting means for detecting positions of said reference plates with respect to an exposure optical axis direction of the projection optical system as each of said reference plates is placed, sequentially, at the detection position;

measuring means for measuring a position of said first movable stage with respect to the scan direction;

storing means for storing therein the positions with respect to the optical axis direction as detected by said detecting means and the position with respect to the scan direction at the corresponding moment; and correcting means for correcting, during the scan of the first and second objects, a positional relation between the projection optical system and a surface of the second object to be exposed, with respect to the optical axis direction, on the basis of the stored positional relation between the reference plates and the projection optical system.

18. A scanning exposure apparatus for exposing a wafer to a pattern formed on a mask through a projection optical system, while a mask stage carrying the mask thereon and a wafer stage carrying the wafer thereon are scanningly moved in a timed relation with each other, said exposure apparatus comprising:

reference marks provided on the mask stage and being arrayed along a scan direction, wherein the mask stage is movable so as to place at least one of said reference marks at a detection position;

detecting means for detecting a positional relation between the projection optical system and the at least one of said reference marks, in an optical axis direction of the projection optical system; and correcting means for correcting a positional relation between the projection optical system and a pattern surface of the mask, in the optical axis direction, on the basis of the detected positional relation between the projection optical system and the at least one of said reference marks.

19. An apparatus according to claim 18, further comprising means for calculating a tilt of the pattern surface of the mask in a direction orthogonal to the optical axis of the projection optical system, wherein said correcting means corrects the positional relation between the projection optical system and the mask pattern surface, including the tilt.

20. An apparatus according to claim 18, wherein said reference marks are disposed at opposite sides of the mask stage, outside an area of the mask stage where the mask is to be placed.

21. An apparatus according to claim 18, wherein each of said reference marks has a light transmissivity.

22. An apparatus according to claim 21, wherein said detecting means is arranged so that as the at least one reference mark is illuminated with detection light, light transmitted through the reference mark passes through the projection optical system and illuminates a reflection plate provided on the wafer stage and the reflection light from the reflection plate illuminates the at least one reference mark through the projection optical system, such that said detecting means detects the positional relation between the projection optical system, such that said detecting means detects the positional relation between the projection optical system and the at least one reference mark on the basis of a quantity of light passed through the at least one reference mark.

23. An apparatus according to claim 21, wherein, as the wafer stage is moved in the optical axis direction of the projection optical system, said detecting means detects the positional relation between the projection optical system and the at least one reference mark on the basis of a quantity of light passed through the at least one reference mark at different positions of the wafer stage.

24. A device manufacturing method using a scanning exposure apparatus for exposing a wafer to a pattern formed on a mask through a projection optical system, while a mask stage carrying the mask thereon and a wafer stage carrying the wafer thereon are scanningly moved in a timed relation with each other, said method comprising:

providing reference marks on the mask stage, the reference marks being arrayed along a scan direction;

moving the mask stage so as to place at least one of the reference marks at a detection position;

detecting a positional relation between the projection optical system and the at least one of the reference marks, in an optical axis direction of the projection optical system; and correcting a positional relation between the projection optical system and a pattern surface of the mask, in the optical axis direction, on the basis of the detected positional relation between the projection optical system and the at least one of the reference marks.

25. The method of claim 24, further comprising the steps of:

calculating a tilt between the projection optical system and the mask pattern surface in a direction orthogonal to the optical axis of the projection optical system; and correcting the positional relation between the projection optical system and the pattern surface of the mask on the basis of the calculated tilt in the projection optical system.

26. The method of claim 24, wherein said providing step comprises providing the reference marks at opposite sides of the mask stage, outside an area where the mask is to be placed.

27. The method of claim 24, wherein each of the reference marks has a light transmissivity.

28. The method of claim 27, wherein said detecting step comprises illuminating the at least one of the reference marks with detection light, such that light transmitted through the at least one reference mark passes through the projection optical system and illuminates a reflection plate provided on the wafer stage, and reflection light from the reflection plate illuminates the at least one reference mark through the projection optical system, such that the positional relation between the projection optical system and the at least one reference mark is detected on the basis of a quantity of light passed through the at least one reference mark.

29. The method of claim 27, wherein said detecting step further comprises detecting the positional relation between the projection optical system and the at least one reference mark on the basis of a quantity of light passed through the at least one reference mark at different positions of the wafer stage as the wafer stage is moved in the optical axis direction.

30. A scan transfer apparatus in which, while an original stage having an original placed thereon and a substrate stage having a substrate placed thereon are relatively scanningly moved, a pattern formed on the original is transferred onto the substrate by exposure through a projection optical system, said apparatus comprising:

reference marks provided on the original stage, said reference marks being arranged along a scan direction, wherein the original stage is movable so as to sequentially position each of said reference marks at a detection position;

detecting means for detecting each of position relations between the substrate and each of said reference marks on the original stage, in an optical axis direction of the projection optical system; and correcting means for correcting a positional relation between the substrate and the original, in the optical axis direction, on the basis of the detected positional relations.

* * * * *

UNITED STATES PATENT AND TRADEMARK OFFICE
CERTIFICATE OF CORRECTION

PATENT NO. : 6,473,156 B2
DATED : October 29, 2002
INVENTOR(S) : Yoshiharu Kataoka It is certified that error appears in the above-identified patent and that said Letters Patent is hereby corrected as shown below:

Column 5,
Line 35, "(111*a* - 11*c*)" should read -- (111*a* - 111*c*) --.

Column 8,
Line 3, "LSIS)," should read -- LSIs), --.

Column 9,
Line 49, "is" should read -- being --.

Column 10,
Lines 11, 30, 48 and 62, "is" should read -- being --.

Column 12,
Line 20, "patterns," should read -- patterns, said reference plates being arrayed along a scan direction of said scanning means, and --.

Signed and Sealed this

Fifteenth Day of April, 2003

JAMES E. ROGAN
*Director of the United States Patent and Trademark Office*